(12) United States Patent
Hayashi

(10) Patent No.: US 6,366,396 B1
(45) Date of Patent: Apr. 2, 2002

(54) SEMICONDUCTOR LASER MODULE AND AN OPTICAL AMPLIFIER INSTALLING THE SAME

(75) Inventor: Hideki Hayashi, Kanagawa (JP)

(73) Assignee: Sumitomo Electric Industries, LTD, Osaka (JP)

( * ) Notice: Subject to any disclaimer, the term of this patent is extended or adjusted under 35 U.S.C. 154(b) by 0 days.

(21) Appl. No.: 09/590,383

(22) Filed: Jun. 9, 2000

(30) Foreign Application Priority Data

Jun. 10, 1999 (JP) .......................................... 11-164523

(51) Int. Cl.[7] ................................................ H01S 3/00
(52) U.S. Cl. .......................................... 359/344; 385/92
(58) Field of Search ................................ 359/341, 333, 359/344; 385/92

(56) References Cited

U.S. PATENT DOCUMENTS

| | | | | |
|---|---|---|---|---|
| 5,914,972 A | * | 6/1999 | Siala et al. ..................... 372/33 |
| 6,208,456 B1 | * | 3/2001 | Lawrence ..................... 359/333 |
| 6,215,809 B1 | * | 4/2001 | Ziara et al. ..................... 372/96 |
| 6,226,311 B1 | * | 5/2001 | Meliga et al. ............... 372/102 |

* cited by examiner

Primary Examiner—Mark Hellner
(74) Attorney, Agent, or Firm—Smith, Gambrell & Russell LLP

(57) ABSTRACT

A semiconductor laser module comprises a light-emitting element 35 having a pair of opposed edge faces. One of edge face forms a reflective surface, and the other one thereof forms a low reflective surface. An optical fiber 20 has a diffraction grating 20a which functions as a deflector optically coupled to the low reflective surface of the light-emitting element 35. The diffraction grating 20a is formed close to the end portion of the optical fiber. The reflective surface of the light-emitting element 35 and the diffraction grating 20a formed in the optical fiber are used to form an optical resonator. The refraction grating 20a is formed so as to be positioned within a ferrule 60 fitted to the end portion of the optical fiber 20. The light-emitting element 35 is mounted in a package 10 not via temperature control member. The ferrule 60 is mechanically fixed to the package 10.

7 Claims, 4 Drawing Sheets

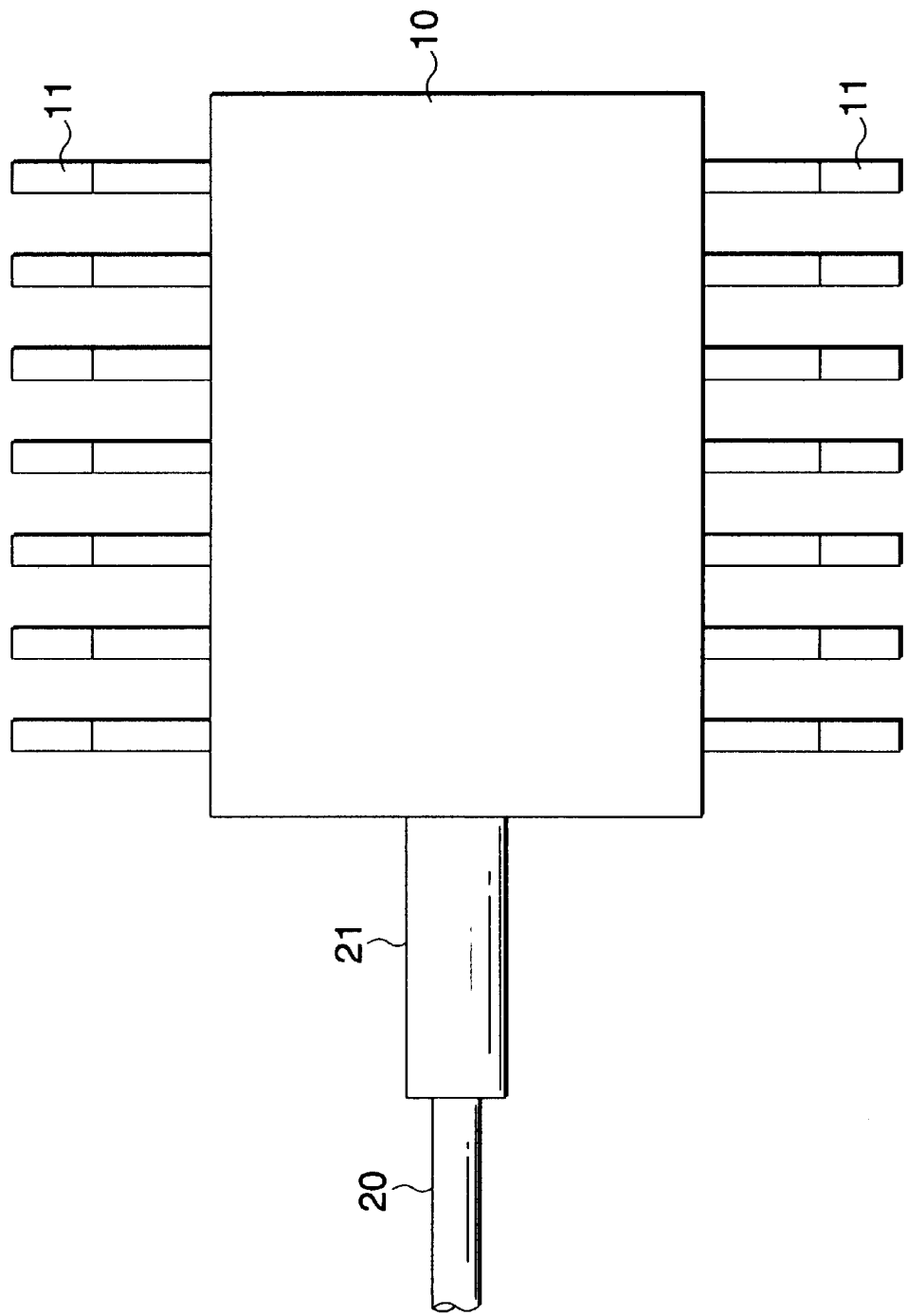

ns to a semiconductor laser
SEMICONDUCTOR LASER MODULE AND AN OPTICAL AMPLIFIER INSTALLING THE SAME

BACKGROUND OF THE INVENTION

1. Field of the Invention

The present invention relates to a semiconductor laser module and an optical amplifier installing the same. More particularly, the present invention relates to a semiconductor laser module adequate for a pumping light source in an optical amplifier and the optical amplifier installing the same.

2. Description of the Related Art

A high output greater than hundreds of mW is required for laser modules as a pumping light sources in optical amplifiers. Therefore, it has been an extremely important problem to dissipate the heat generated in a semiconductor laser chip because a large drive current is injected to the chip.

Such semiconductor laser modules as pumping light sources generally employ a so-called butterfly type package. FIG. 4 is a sectional view of a typical semiconductor laser module using the butterfly type package mentioned above.

As shown in FIG. 4, a semiconductor laser chip 35 is mounted on a submount 31, the submount 31 is mound on a base 30, and the base 30 is mounted on a cooling means 34. These members including the base 30, the submount 31, the cooling means 34 and the semiconductor laser chip 35 are integrally contained in a package 10. In this case, the package 10 is made of metal material such as nickel-Kovar.

The package 10 is substantially cubic and has a window on one side wall. An optical fiber 20 is projected from the window into the package 10 via a sleeve 22. The sleeve 22 contains a ferrule 21 fitted to the front end of the package 10. The center axis of the sleeve 22 and the center axis of the ferrule 21 are arranged in such a manner that their relative positions are regulated, so that the optical axis of the optical fiber 20, which substantially conforms to the center of the ferrule, is efficiently coupled to the semiconductor laser chip 35.

A condenser lens 32 is disposed on the light axis. Moreover, a light-receiving element 33 is disposed in the rear of the semiconductor laser chip 35 so as to control the drive current to the semiconductor laser chip under so-called APC (Auto Power Control).

As the cooling means, a Peltier element is often employed. By the current passing therethrough, a one-side electrode thereof (simultaneously used as the base 30) is cooled and the other electrode side in contact with the package is heated.

FIG. 5 is a plan view of the package used in the semiconductor laser module shown in FIG. 4.

As shown in FIG. 5, the package 10 is rectangular as viewed from above and the optical fiber 20 fixed via the sleeve is projected from one edge face thereof. A plurality of lead pins 11 are led out from a pair of opposed sides of the package 10. These lead pins 11 include a power supply line toward the semiconductor laser, a drive signal line, a light-receiving signal line from a monitor PD, a power supply line toward the Peltier element, a detection signal line for detecting the temperature of the upper electrode of the Peltier element and so forth.

Although the butterfly package has a large internal space for containing the Peltier element therein, it has problems that the package itself is large in size and has to be made of expensive metal material. Further, although the package made of metal satisfies requirements of high-performance for semiconductor laser modules, it has a problem that an insulating process is needed for the lead pins. Nevertheless, this type of semiconductor laser modules are very expensive and not necessarily high in productivity, that is, not fit for mass production.

However, optical amplifiers using erbium doped fibers (hereinafter called 'EDf') have used in not only trunk lines but also subscriber lines in recent optical communication systems. Therefore, the mass production for semiconductor laser modules as pumping light sources is required. Moreover, the size-reduction is required rather than the mass production in the subscriber line system. Accordingly, the conventional semiconductor laser modules do not meet the requirement for size-reduction.

SUMMARY OF THE INVENTION

An object of the present invention to provide a semiconductor laser module that can be mass-produced less costly and reduced in size and an optical amplifier installing the same that can be mass-produced less costly.

A semiconductor laser module according to the invention comprises a light-emitting element, a package, an optical fiber and a ferrule. The light-emitting element has a reflective surface and an antireflective surface at opposed edge faces. The package houses the light-emitting element therein. The optical fiber has a diffraction grating optically coupled to the antireflective surface of the light-emitting element. The reflective surface of the light-emitting element and the diffraction grating formed in the optical fiber form an optical resonator. The ferrule is secured relative to the package and holding an end portion of the optical fiber therein. The light-emitting element is mounted on the package without providing a temperature control member therebetween, and the diffraction grating is formed close to the end portion of the optical fiber so as to be positioned within the ferrule.

The semiconductor laser module according to the invention preferably includes light concentrating member provided between the light-emitting element and the optical fiber.

In the semiconductor laser module according to the invention, the reflective bandwidth of the diffraction grating may be selected to include a plurality of longitudinal modes of the light-emitting element. The longitudinal modes thereof are determined by the distance between the reflective surface and the antireflective surface of the light-emitting element. The central wavelength of the bandwidth may exist substantially in a 1.48 μm band.

The semiconductor laser module according to the invention may further include an amplifying optical fiber with erbium doped in a predetermined portion of a core thereof, and a light-introducing member introducing the light emitted from the optical fiber into the amplifying optical fiber. This semiconductor laser module may also functions as an optical amplifier for amplifying signal light having a wavelength in a 1.55 μm band.

BRIEF DESCRIPTION OF THE DRAWINGS

FIG. 5 is a plan view of shape of the typical conventional semiconductor laser module.

DESCRIPTION OF THE PREFERRED EMBODIMENTS

Figure 1:
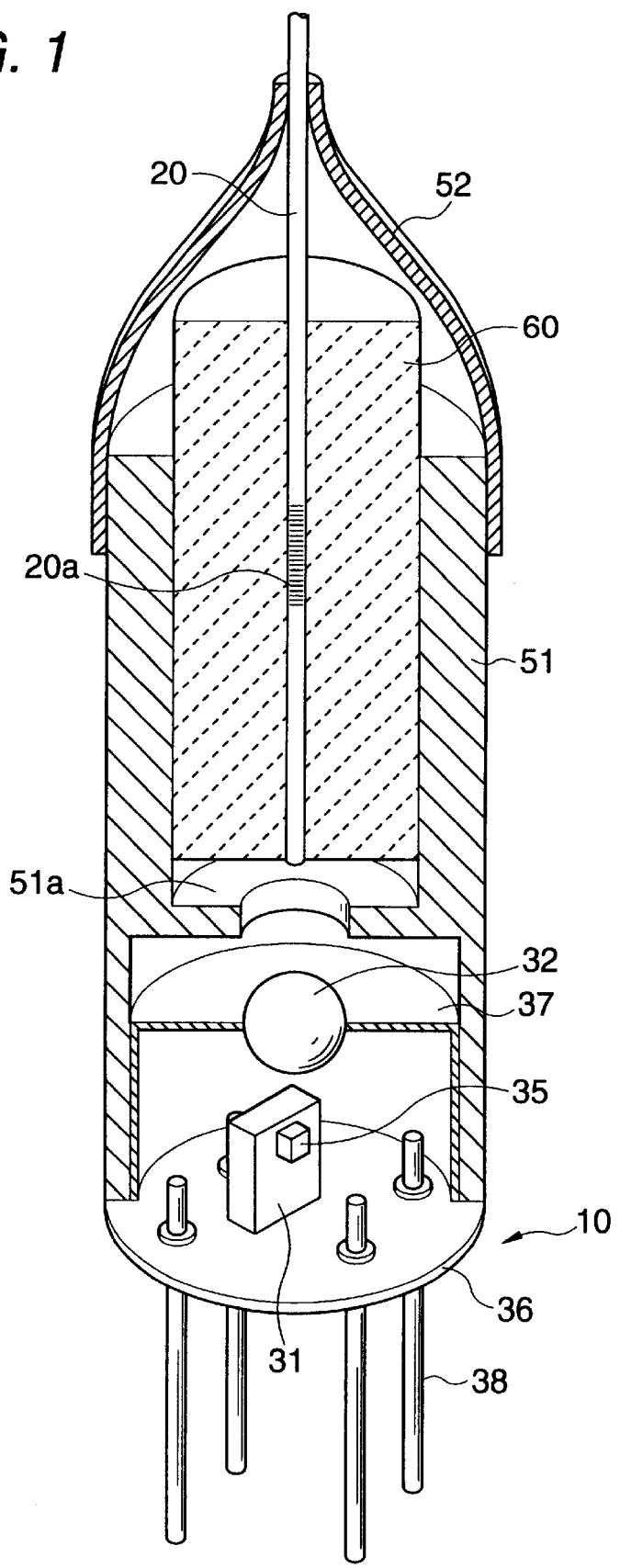
FIG. 1 is a sectional view of an embodiment of arrangement of a semiconductor laser module according to the invention.

FIG. 1 is a sectional view of an embodiment of an arrangement of a semiconductor laser module according to the invention.

As shown in FIG. 1, a semiconductor laser chip 35 in the semiconductor laser module is contained in a package 10 via a submount 31. The package 10 is in conformity with a TO type package sold on the market.

More specifically, the package 10 essentially consists of a base 36 and a cap 37. The submount 31 is fixed onto the base 36 and the semiconductor laser chip 35 is fixed to one side of the submount 31. The peripheral edge portion of the cap 37 is coupled to the base 36 and arranged so as to store the semiconductor laser chip 35 therein. Further, a window is provided in the top of the cap 37 and on an optical axis of the light emitted from the semiconductor laser chip 35. A condenser lens 32 is fitted in the window. In this case, the base 36, the submount 31 and the cap 37 may be made of ordinary material such as Kovar.

Further, in this semiconductor laser module, a plurality of lead pins 38 are passed through the base 36 and led out of the package. One of the lead pins is used as a grounding pin that is electrically connected to the base 36 and also commonly used as the anode electrode of the semiconductor laser chip 35. Other pins are used to supply drive signals to a semiconductor laser. Provision of parallel lead pins corresponding to various functions can improve stability during the high-speed operation.

A sleeve 51 is mounted in such a manner as to overhang the cap 37 of the package 10 as shown in FIG. 1. In other words, the sleeve 51 as a whole is substantially cylindrical and its one end is inserted into the package 10, whereas a ferrule 60 fitted onto an optical fiber 30 is passed therethrough from the other end. Actually, the package-side inner diameter of the sleeve 51 is set slightly greater than the outer diameter of the cap 37. The optical axis of the semiconductor laser chip 35 can be made to precisely coincide with that of the optical fiber 20 by sliding the edge face of the sleeve 51 on the base 36 of the package 10 while bringing the former into contact with the latter.

A rib 51a is provided on the inner side of the sleeve 51, whereby the ferrule 60 thus inserted abuts against the rib 51a. Consequently, the ferrule 60 will never be brought into direct contact with the condenser lens 32 fitted to the package 10. Moreover, adjustment of the front end position of the optical fiber 20 can be made by bringing the ferrule 60 into contact with the rib 51a once and then slowly pulling it back.

In the above-mentioned semiconductor laser module, the front edge face of the optical fiber 20 and the edge face of the ferrule 60 are molded so that both may form an equal plane. This plane is not perpendicular to the light emitted from the semiconductor laser but tilted by a predetermined angle thereto. The formation of the edge face of the optical fiber like this prevents the light reflected from the edge face of the optical fiber out of what is emitted from the semiconductor laser chip from returning to the semiconductor laser chip. This makes it possible to suppress the production of light noise.

In a case where metal, such as SUS, is used for the sleeve 51 in the semiconductor laser module, YAG laser welding is generally used to join the sleeve 51 to the base, whereas when resin material is used for the sleeve 51, a bonding adhesive is used to join the sleeve 51 to the base. On the other hand, though ceramics such as zirconia is generally used for the ferrule 60, any plastic ferrule may also be used.

In the semiconductor laser module thus arranged, a high reflective film having a 95% reflectance is formed on the edge face opposite to that facing the optical fiber 20 of the semiconductor laser chip 35. The other edge face facing the optical fiber is processed so that it has an extremely low reflectance of 1% or less. An antireflective surface is directed to the extremely low reflectance. Therefore, no laser oscillation is occurred by a single body of semiconductor laser chip 35 because the semiconductor laser chip 35 has only one reflective surface. In other words, an optical resonator for producing laser oscillation has a pair of opposed reflectors and in the semiconductor laser module, a diffraction grating formed in the optical fiber 20, which will be described below, is utilized as another reflector.

For the purpose mentioned above, a diffraction grating 20a is formed in the portion covered with the ferrule of the optical fiber 20. Since the diffraction grating 20a functions as a reflector having a specific wavelength, the diffraction grating 20a and the high reflective film formed on the semiconductor laser chip 35 can form the optical resonator.

A longitudinal mode of light emission of the semiconductor laser module is determined by the geometric length of the optical resonator thus formed. As the longitudinal mode is deeply related the final oscillation wavelength as will be described later, it is preferable to prevent the characteristics of the resonator from changing. Consequently, according to this embodiment of the invention, the position of the diffraction grating 20a is set inside the ferrule 60 to avoid the diffraction grating 20a to be affected by stress affected from the outside of the module.

Although the semiconductor laser module is not particularly equipped with a cooling means, there will develop no problem because desired light intensity for pumping is low while the semiconductor laser module is used in subscriber lines in comparison with cases where it is used in trunk lines. Further, as will be described below, fluctuations in characteristics due to temperature changes can be suppressed by properly setting the semiconductor laser module.

In the semiconductor laser module thus arranged, the oscillation wavelength is determined as follows.

Figure 2:
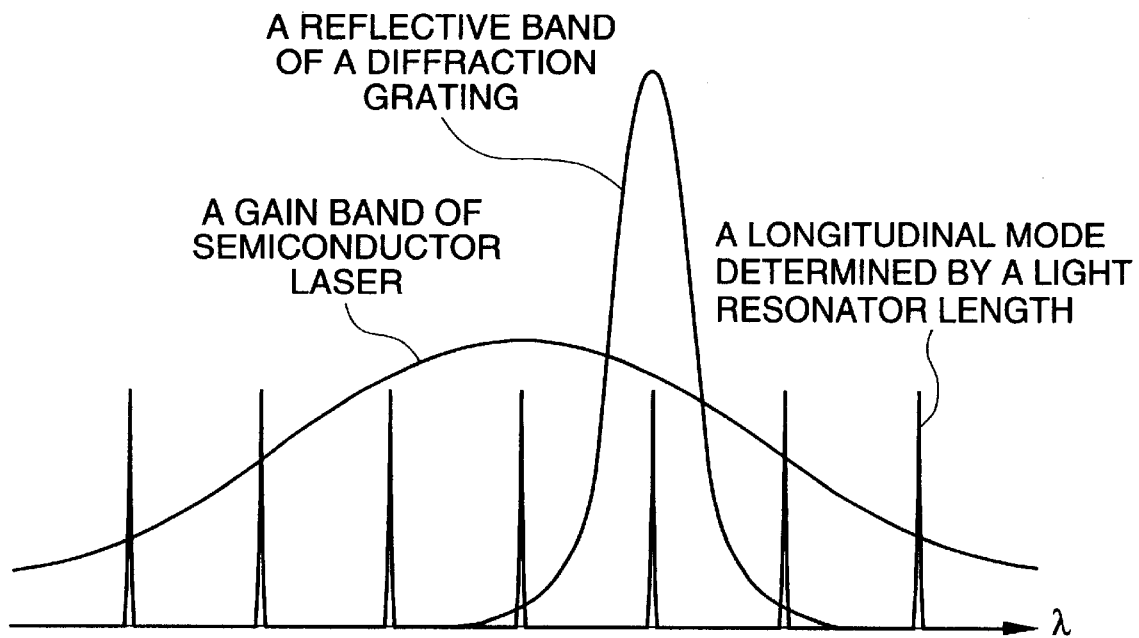
FIG. 2 is a chart explanatory of the process of determining the oscillation wavelength of the semiconductor laser.

FIG. 2 is a chart explanatory of the process of determining the oscillation wavelength of the semiconductor laser module. The oscillation wavelength of the laser module is, as shown in FIG. 2, determined by three conditions including the gain band determined by the internal quantum state of the semiconductor optical amplifier, the longitudinal mode determined by the resonator length and the diffraction wavelength of the diffraction grating.

In this case, the gain band is determined by the semiconductor material used for the semiconductor laser chip 35 and the operating temperature (to be precise, determined by the product of the joint density of states between the conduction band ant the valence band, and Fermi distribution function). However, the gain band is sufficiently wider than the bands determined by the other two conditions.

The longitudinal modemodes includes the first longitudinal mode determined by the geometric length of the light resonator formed between the diffraction grating 20a and one edge face of the semiconductor laser, and the second longitudinal mode determined by the geometric distance between both edge faces of the semiconductor laser chip 35.

A film having the extremely low reflectance is formed on the other edge face opposite to the optical fiber of the semiconductor laser chip 35. Actually, the reflectance of the low reflective film is impossible to be completely zero. Consequently, the second longitudinal mode cannot be ignored.

In the case of the first longitudinal mode, its interval, that is the wavelength interval between adjacent longitudinal modes, is narrowed as the position of the diffraction grating 20a is set farther from the edge face of the semiconductor laser chip 35. Further, the effective length of the resonator varies with the temperature change, according to the dependence of the refractive index on the temperature in the semiconductor laser. The temperature variation affects both the first and second longitudinal modes.

As the distance between the high reflective film and the diffraction grating is far greater than the distance between both edge faces of the semiconductor laser chip, however, the variation of the second longitudinal mode conspicuously contributes to the longitudinal mode fluctuation of the oscillation. More specifically, the former produces variation that appears to be continuous while the latter is in a discrete mode. Therefore, the influence of longitudinal mode shifting due to the temperature change can be eased by setting the reflective bandwidth of the diffraction grating 20a to a width to the extent so that a plurality of longitudinal modes by the latter exist in the reflective band.

Figure 3:
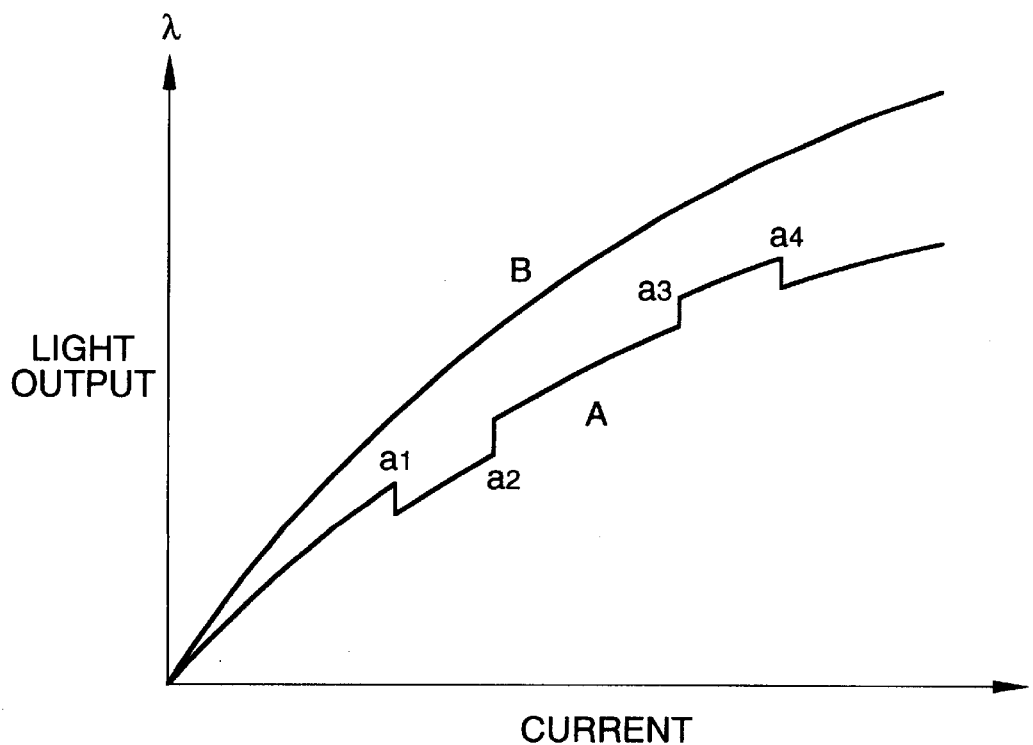
FIG. 3 is a graph explanatory of output fluctuation in a semiconductor laser.
Figure 4:
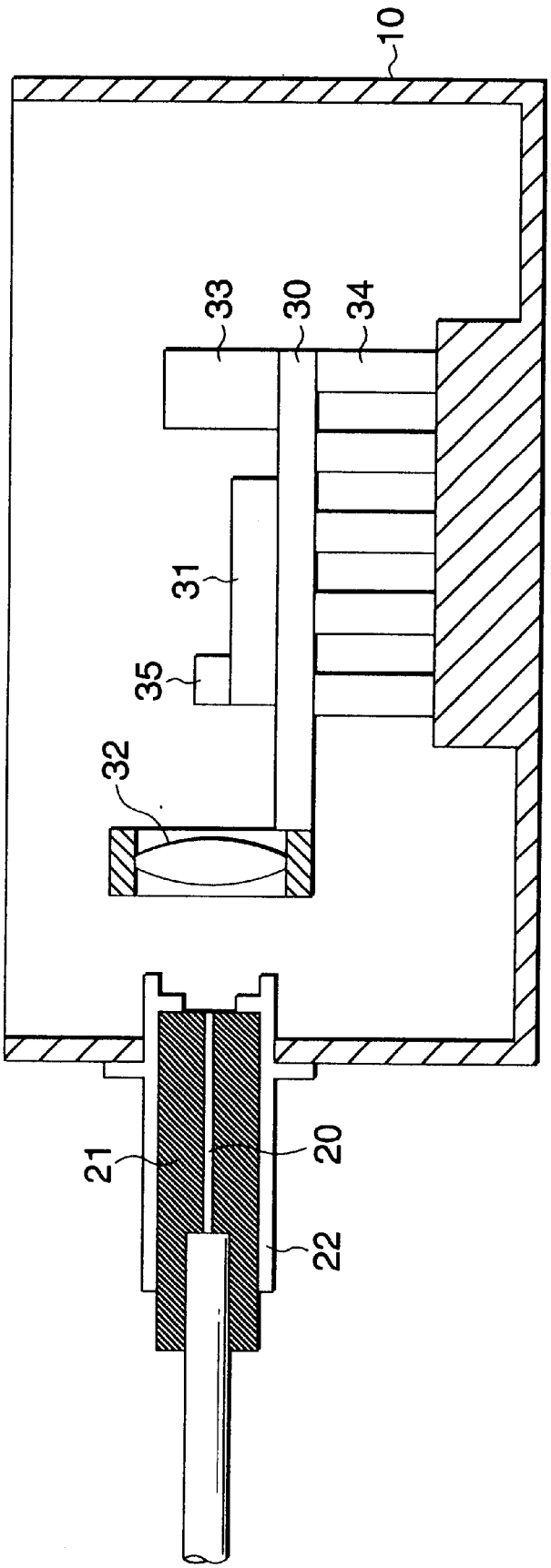
FIG. 4 is a sectional view of the structure of a typical conventional semiconductor laser module.

FIG. 3 is a graph showing differences in characteristics; that is, the current supplied to the semiconductor laser is plotted on the abscissa axis, whereas the light output is plotted on the ordinate axis.

As shown in FIG. 3, many discontinuous points a1–a4 appear as represented by a curve A when the number of longitudinal mode lines within the reflective bandwidth of the diffraction grating is small. More specifically, the longitudinal mode shifts because of self-heat-generation as the drive current supplied to the semiconductor laser chip increases. Accordingly, one longitudinal mode is released from the reflective bandwidth at the discontinuous point a1, which results in reducing the output. Subsequently, the light output discontinuously rises because the next longitudinal mode (which has a wavelength adjacent to that of the released longitudinal mode) enters the bandwidth at the discontinuous point a2. The light output also sharply fluctuates at the discontinuous points a3 and a4.

The temperature of the semiconductor laser chip has to be controlled to avoid the phenomenon above and to this end, the cooling means such as a Peltier element has positively been provided in the conventional semiconductor laser chip. However, accommodation of a large part like this within the package makes it unavoidable to increase not only the size of the semiconductor laser chip but also the production cost of such a semiconductor laser chip.

As a result, according to this embodiment of the invention, a wide reflective bandwidth is secured in the semiconductor laser chip, so that the plurality of longitudinal modes exist within the bandwidth. With this arrangement, the discontinuous points disappear as shown by a curve B in FIG. 3. In other words, since the plurality of longitudinal modes always exist within bandwidth even though the longitudinal mode is shifted because of the self-heat-generation by the drive current, the influence of the disappearance or appearance of the longitudinal mode can be avoided. Therefore, smooth characteristics of light output are realizable without the cooling means.

As set forth above in detail, the semiconductor laser module according to the invention is quite simple in construction and its assembly work is easily done while desired specification is readily achievable. Accordingly, the semiconductor laser module according to this embodiment of the invention is fit for mass production as its production cost is reducible.

Since stable output characteristics are available without providing temperature control member, this contributes to reducing the size and price of the semiconductor laser module.

As the semiconductor laser module needs no side space for electrical connection, its packaging area is also reducible.

The above-mentioned semiconductor laser module according to the invention can be used as a pumping light source in optical amplifier using an erbium doped fiber and a light-introducing member which introduces the light emitted from the optical fiber of the semiconductor laser module into the erbium doped fiber. Such an optical amplifier, for example, amplifies signal light having a wavelength of 1.55μ.

What is claimed is:

1. A semiconductor laser module, comprising:
    a light-emitting element, having a reflective surface and an antireflective surface at opposed edge faces;
    a package, having the light-emitting element mounted therein without a temperature control member provided therebetween;
    an optical fiber, provided with a diffraction grating which is optically coupled to the antireflective surface of the light-emitting element, the reflective surface of the light-emitting element and the diffraction grating forming an optical resonator;
    a ferrule, secured to the package, holding an end portion of the optical fiber provided with the diffraction grating, so that the diffraction grating is positioned within the ferrule; and
    a substantially cylindrical sleeve, slidably fitted to the package, which holds the ferrule therein, and which is provided with a rib on an inner portion thereof close to an end, the rib abutting against an end face of the ferrule so that the ferrule does not contact a light concentrating member fitted to the package.

2. The semiconductor laser module according to claim 1, further comprising the light concentrating member, provided between the light-emitting element and the optical fiber.

3. The semiconductor laser module according to claim 1, wherein a reflective bandwidth of the diffraction grating is selected so as to include a plurality of longitudinal modes of the light-emitting element, which are determined by a distance between the reflective surface and the antireflective surface of the light-emitting element.

4. The semiconductor laser module according to claim 3, wherein a central wavelength of the reflective bandwidth exists substantially in a 1.48 μm band.

5. The semiconductor laser module according to claim 1, further comprising:
    an amplifying optical fiber, doped with erbium atoms in a portion of a core thereof; and
    a light-introducing member, for introducing the light emitted from the optical fiber into the amplifying optical fiber,
    wherein the semiconductor laser module functions as an optical pumping source for exciting the erbium atoms in the amplifying optical fiber at a wavelength of 1.55 μm.

6. The semiconductor laser module according to claim 3, further comprising:

an amplifying optical fiber, doped with erbium atoms in a portion of a core thereof; and a light-introducing member, for introducing the light emitted from the optical fiber into the amplifying optical fiber, wherein the semiconductor laser module functions as an optical pumping source for exciting the erbium atoms in the amplifying optical fiber at a wavelength of 1.55 µm.

7. The semiconductor laser module according to claim 1, wherein the ferrule is secured to the package mechanically.

* * * * *